(12) United States Patent
Kuo et al.

(10) Patent No.: US 11,774,660 B2
(45) Date of Patent: Oct. 3, 2023

(54) ELECTRONIC DEVICE INCLUDING ADHESIVE WITH FIRST AND SECOND OPENING

(71) Applicant: Innolux Corporation, Miao-Li County (TW)

(72) Inventors: Fu Kuo, Tainan (TW); May Pan, Tainan (TW); Maggy Hsu, Magong (TW); Lavender Cheng, Tainan (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/892,944

(22) Filed: Aug. 22, 2022

(65) Prior Publication Data

US 2023/0074248 A1  Mar. 9, 2023

Related U.S. Application Data

(63) Continuation of application No. 17/466,072, filed on Sep. 3, 2021, now Pat. No. 11,448,812.

(51) Int. Cl.
| | |
|---|---|
| *F21V 8/00* | (2006.01) |
| *H01L 25/075* | (2006.01) |
| *H01L 33/48* | (2010.01) |
| *G02F 1/1333* | (2006.01) |
| *G02F 1/1335* | (2006.01) |

(52) U.S. Cl.
CPC .......... *G02B 6/0031* (2013.01); *G02B 6/009* (2013.01); *G02B 6/0055* (2013.01); *G02B 6/0068* (2013.01); *G02B 6/0083* (2013.01); *G02B 6/0091* (2013.01); *H01L 25/0753* (2013.01); *H01L 33/483* (2013.01); *H01L 33/486* (2013.01); *G02F 1/133314* (2021.01); *G02F 1/133524* (2013.01)

(58) Field of Classification Search
CPC ... G02B 6/009; G02B 6/0091; H01L 25/0753; H01L 33/483; H01L 33/486; H05K 2201/10106
See application file for complete search history.

(56) References Cited

U.S. PATENT DOCUMENTS

| | | | |
|---|---|---|---|
| 2015/0124197 A1* | 5/2015 | Yeom | G02B 6/0091 156/247 |
| 2019/0025498 A1* | 1/2019 | Kaneki | G02B 6/009 |

* cited by examiner

*Primary Examiner* — Keith G. Delahoussaye
(74) *Attorney, Agent, or Firm* — Patterson + Sheridan, LLP

(57) ABSTRACT

A electronic device is provided. The electronic device includes a circuit board, a first light-emitting element and a second light-emitting element disposed on the circuit board along a first direction. The backlight module includes a light guide plate and an adhesive structure between the circuit board and the light guide plate and having a first opening and a second opening. The first and second light-emitting elements are disposed in the first and second openings respectively. A portion of the adhesive structure disposed between the first and second openings includes a first part and a second part, the first part is disposed between the first and second light-emitting elements, and the second part is connected with the first part and extends toward the light guide plate. A second maximum width of the second part is greater than a first maximum width of the first part along the first direction.

10 Claims, 9 Drawing Sheets

ELECTRONIC DEVICE INCLUDING ADHESIVE WITH FIRST AND SECOND OPENING

CROSS REFERENCE TO RELATED APPLICATIONS

This application is a Continuation of pending U.S. patent application Ser. No. 17/466,072, filed Sep. 3, 2021 and entitled "BACKLIGHT MODULE INCLUDING AN ADHESIVE STRUCTURE AND ELECTRONIC DEVICE INCLUDING THE SAME," the entirety of which is incorporated by reference herein.

BACKGROUND

Field of the Disclosure

The present disclosure relates to an electronic device, and in particular to an electronic device including an adhesive structure.

Description of the Related Art

Backlight module is used in electronic devices. In present backlight module, a light guide plate is attached to the circuit board through the adhesive structure. However, how to reduce the risk of the shifting between the light guide plate and the circuit board is an important issue.

BRIEF SUMMARY

Some embodiments of the disclosure provide an electronic device, including: circuit board, a first light-emitting element and a second light-emitting element disposed on the circuit board along a first direction. The backlight module includes a light guide plate and an adhesive structure between the circuit board and the light guide plate and having a first opening and a second opening. The first and second light-emitting elements are disposed in the first and second openings respectively. A portion of the adhesive structure disposed between the first and second openings includes a first part and second part, the first part is disposed between the first and second light-emitting elements, and the second part is connected with the first part and extends toward the light guide plate. A second maximum width of the second part is greater than a first maximum width of the first part along the first direction.

BRIEF DESCRIPTION OF THE DRAWINGS

The present disclosure can be more fully understood by reading the subsequent detailed description and examples with references made to the accompanying drawings, wherein.

DETAILED DESCRIPTION

Figure 1:
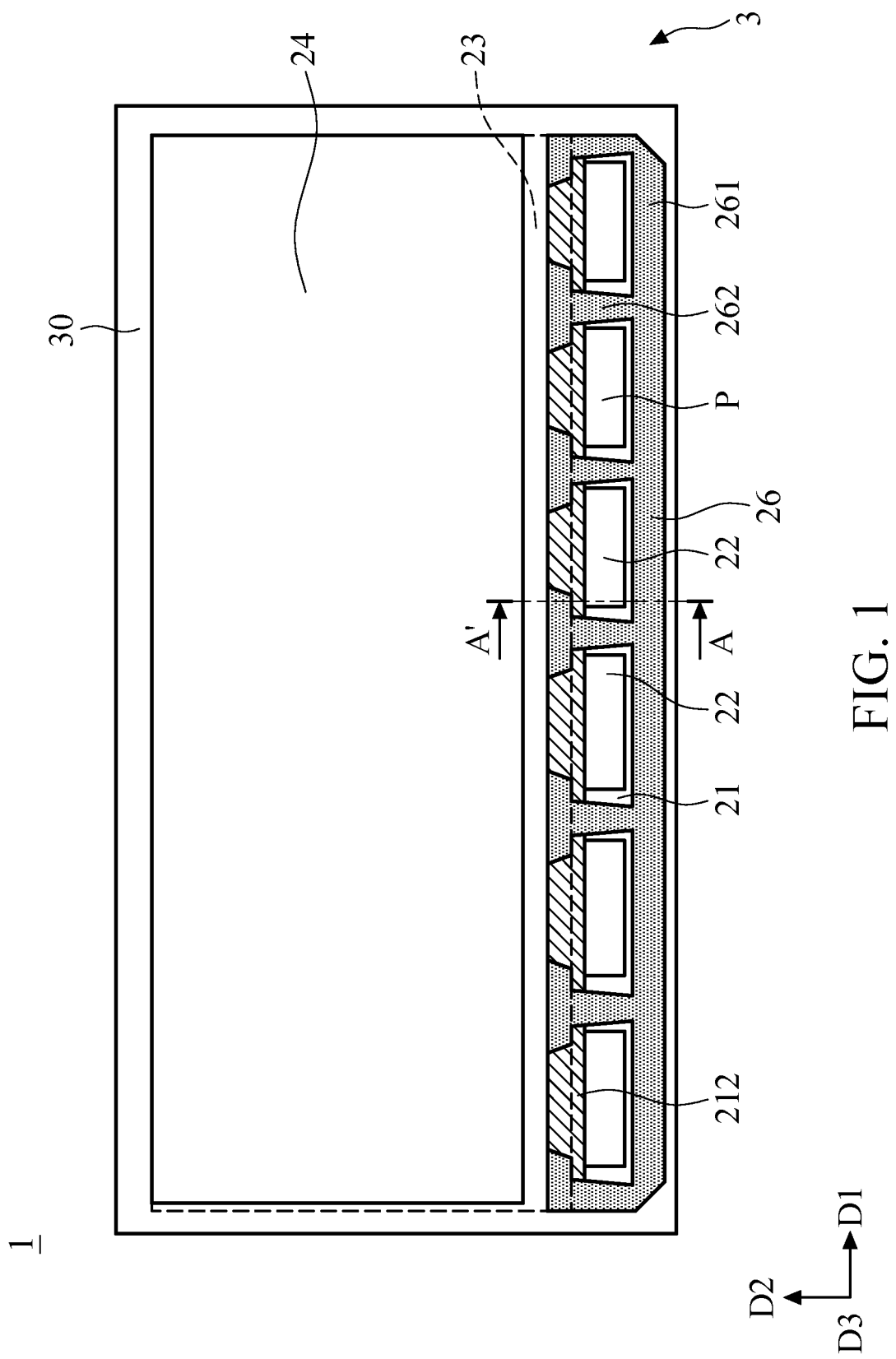
FIG. 1 is a top view illustrating an electronic device in accordance with some embodiments of the present disclosure.

The backlight module and electronic device of the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. The embodiments are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The present disclosure can be understood by referring to the following detailed description in connection with the accompanying drawings. It should be noted that, in order to allow the reader to easily understand the drawings, several drawings in the present disclosure only depict a portion of the electronic device, and the specific elements in the drawings are not drawn to scale. In addition, the number and size of each element in the drawings are only for illustration and the scope of the present disclosure is not limited thereto.

Certain terms may be used throughout the present disclosure and the appended claims to refer to particular elements. Those skilled in the art will understand that electronic device manufacturers may refer to the same components by different names. The present specification is not intended to distinguish between components that have the same function but different names. In the following specification and claims, the words "including", "comprising", "having" and the like are open words, so they should be interpreted as meaning "including but not limited to . . . ". Therefore, when terms "including", "comprising", and/or "having" are used in the description of the disclosure, the presence of corresponding features, regions, steps, operations and/or components is specified without excluding the presence of one or more other features, regions, steps, operations and/or components.

Directional terms mentioned in the present disclosure, such as "upper", "lower", "front", "rear", "left", "right", etc., are only the directions referring to the drawings. Therefore, the directional terms are used for illustration, not for limiting the scope of the present disclosure. The drawings depict general features of methods, structures, and/or materials used in particular embodiments. However, these drawings should not be interpreted as defining or limiting the scope or property encompassed by these embodiments. For example, for clarity, the relative sizes, thicknesses, and positions of the various layers, regions, and/or structures may be reduced or enlarged.

When a corresponding component (such as a layer or region) is referred to as "(disposed or located) on another component", it may be directly (disposed or located) on another component, or there may be other components between them. On the other hand, when a component is referred to as "directly (disposed or located) on another component", there is no component existing between them. In addition, when a component is referred to as "(disposed or located) on another component", the two have an upper-lower relationship in a top-view direction, and this component may be above or below another component, and the upper-lower relationship depends on the orientation of the device.

The terms "about" or "substantially" are generally interpreted as within 20% of a given value or range, or as interpreted as within 10%, 5%, 3%, 2%, 1%, or 0.5% of a given value or range.

It should be understood that, although the terms "first", "second" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

The ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is used to make a component with a certain name can be clearly distinguished from another component with the same name. The same words may not be used in the claims and the specification. Accordingly, the first component in the specification may be the second component in the claims.

It should be noted that the following embodiments can replace, recombine, and combine features in several different embodiments to complete other embodiments without departing from the spirit of the present disclosure. The features between the various embodiments can be combined and used arbitrarily as long as they do not violate or conflict the spirit of the present disclosure.

In the present disclosure, the thickness, length, and width can be measured by using an optical microscope, and the thickness can be measured by the cross-sectional image in the electron microscope, but it is not limited thereto. In addition, a certain error may be present in a comparison with any two values or directions. If the first value is equal to or same with the second value, it implies that an error of about 10% between the first value and the second value may be present. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

Unless defined otherwise, all terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

FIG. 1 is a top view illustrating an electronic device 1 in accordance with some embodiments of the present disclosure. It should be noted that the electronic device 1 may include a display device, an antenna device, a sensing device, a touch device, a tiled device or a combination thereof. The electronic device may include a bendable, a curved or flexible electronic device or a combination thereof, but is not limited thereto. The electronic device 1 may include light-emitting diode, liquid-crystal, fluorescence, phosphor, quantum dot (QD), other suitable electronic media or a combination thereof, but is not limited thereto. The light-emitting diode in accordance with some embodiments of the present disclosure may include organic light-emitting diode (OLED), inorganic light-emitting diode, mini LED, micro LED or quantum dot (QD) light-emitting diode (which may be referred to as QLED, QDLED), other suitable materials or a combination thereof, but it is not limited thereto. The antenna device may include a liquid-crystal antenna, but it is not limited thereto. In some embodiments, the shape of the electronic device may be rectangle, circle, polygon, a curve-edged shape, or any other suitable shape.

Figure 2:
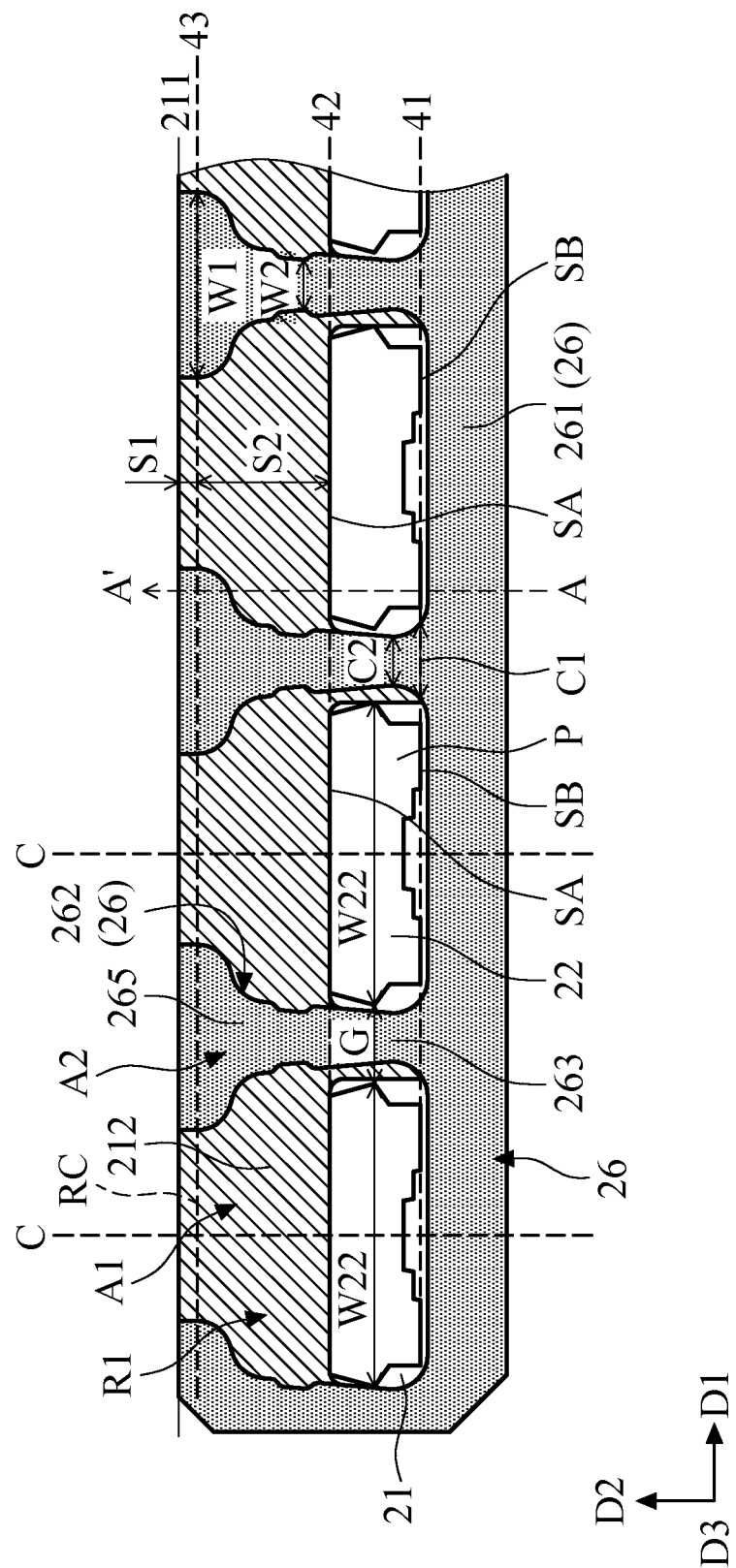
FIG. 2 is an enlarged top view illustrating a backlight module in accordance with some embodiments of the present disclosure.
Figure 3:
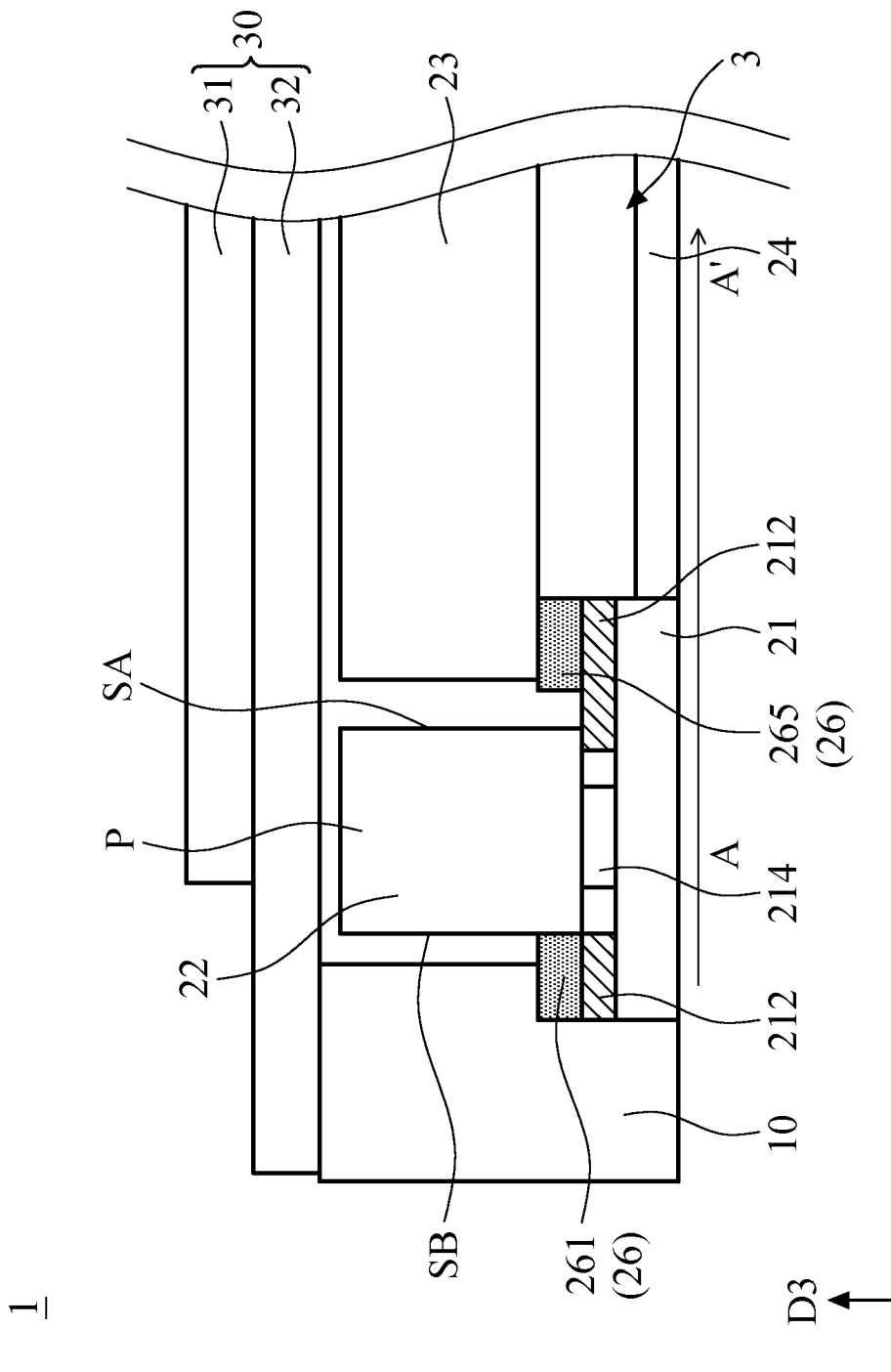
FIG. 3 is a cross-sectional view illustrating the electronic device along line A-A' shown in FIG. 1 in accordance with some embodiments of the present disclosure.

FIG. 2 is an enlarged top view illustrating the backlight module 3 in accordance with some embodiments of the present disclosure. FIG. 3 is a cross-sectional view illustrating the electronic device 1 along line A-A' shown in FIG. 1 in accordance with some embodiments of the present disclosure.

As shown in FIG. 1, FIG. 2 and FIG. 3, the electronic device 1 may include a panel 30 and a backlight module 3 disposed below the panel 30. In some embodiments, the backlight module 3 may include a circuit board 21 and a plurality of light-emitting elements 22 arranged on the circuit board 21 along a first direction D1. It should be understood that the circuit board 21 may include some conductive components, and the conductive components are configured to transmit signals. The circuit board 21 may be flexible or non-flexible circuit board, but it is not limited thereto. In some embodiments, a reflective layer 212 may be disposed on the circuit board 21. In some embodiments, the material of the reflective layer 212 may include an insulating material, such as polyimine, polyimide (PI) or other suitable materials, but it is not limited thereto.

As shown in FIG. 1, FIG. 2 and FIG. 3, the backlight module 3 may include a light guide plate 23 (shown as the dotted line in FIG. 1), a reflection plate 24 and an adhesive structure 26. The light guide plate 23 may be disposed on the circuit board 21 and attached to the adhesive structure 26. In some embodiments, the light guide plate 23 may overlap part of the circuit board 21 or part of the adhesive structure 26 in a normal direction D3 of the circuit board 21. In some embodiments, the light guide plate 23 may be disposed between the panel 30 and the reflection plate 24. In some embodiments, the adhesive structure 26 may be disposed on the circuit board 21. In some embodiments, the adhesive structure 26 may have a connection part 261 and a plurality of segmented elements 262 connected to the connection part 261. In some embodiments, the segmented elements 262 may be separated from each other. In some embodiments, the connection part 261 may extend substantially parallel along the first direction D1, and the segmented elements 262 may extend substantially along a second direction D2 different to the first direction D1. In some embodiments, the first direction D1, the second direction D2 and the normal direction D3 of the circuit board 21 may be substantially perpendicular to each other.

As shown in FIG. 2 and FIG. 3, one of the plurality of segmented elements 262 may have a first part 263 and a second part 265 connected with the first part 263. The first part 263 may be disposed between adjacent ones of the light-emitting elements 22. In some embodiments, the light-emitting elements 22 may have a light emitting surface SA and a back surface SB opposite to the light emitting surface SA, a virtual line 41 may be defined by a connecting line between the most prominent parts of the back surfaces SB of adjacent ones the light-emitting elements 22, and a virtual line 42 may be defined by a connecting line between the most prominent parts of the light emitting surfaces SA of the adjacent ones of the light-emitting elements 22. Accordingly, the virtual line 41 may be closer to the connection part 261 of the adhesive structure 26 than the virtual line 42, or the virtual line 41 may be farther to the light guide plate 23 than the virtual line 42. In some embodiments, an interface between the segmented elements 262 and the connection part 261 may be defined by the virtual line 41, and an interface between one of the first parts 263 of the segmented elements 262 and one of the second parts 265 of the segmented elements 262 may be defined by the virtual line 42, and the one of the first parts 263 may be connected between the one of the second parts 265 and the connection part 261. In other word, the first parts 263 may be defined by a part of the segmented elements 262 located between the virtual line 41 and the virtual line 42, and the second parts 265 may be defined by other part of the segmented elements 262 excluded the first parts 263. In some embodiments, the light guide plate 23 may be attached to a second part 265 of the plurality segmented elements 262 of the adhesive structure 26.

As shown in FIG. 2, in some embodiments, the first width C1 may be a maximum width of the first part 263 in the first direction D1, and the second width W1 may be a maximum width of the second part 265 in the first direction D1, a third width W2 may be a minimum width of the second part 265 in the first direction D1, a fourth width C2 may be a minimum width of the first part 263 in the first direction D1. In some embodiments, the second width W1 may be greater than the first width C1. In some embodiments, the first width C1 and the second width W1 may satisfy the following relation: 1<(second width W1/first width C1)≤7, but it is not limited thereto. In some embodiments, the first width C1 and the second width W1 may satisfy the following relation: 1.5≤(second width W1/first width C1)≤6.5. In some embodiments, the first width C1 and the second width W1 may satisfy the following relation: 2≤(second width W1/first width C1)≤6. By the design as above, the adhesive structure 26 can have larger area to attach to the light guide plate 23, or the design can increase the adhesion between the light guide plate 23 and the circuit board 21.

In some embodiments, the first width C1, the second width W1, the third width W2 and the fourth width C2 may satisfy the following relation: (second width W1/third width W2)>(first width C1/fourth width C2), but it is not limited thereto. By the design as above, the adhesive structure 26 can have larger area to attach to the light guide plate 23, or the design can increase the adhesion between the light guide plate 23 and the circuit board 21.

As shown in FIG. 1, FIG. 2 and FIG. 3, in some embodiments, the circuit board 21 may have a side 211 extending along the first direction D1 and overlapping the light guide plate 23, and a first virtual line 43 may be through a site of the second part 265 with the second width W1. It should be noted that, in some embodiments, the second part 265 may have a plurality of sites with the second width W1, the first virtual line 43 may be defined by a virtual line through one of the plurality of sites of the second part 265 farthest from the side 211 of the circuit board 21. In some embodiments, a distance S1 between the first virtual line 43 and the side 211 of the circuit board 21 may be less than a distance S2 between the first virtual line 43 and one of the light-emitting elements 22 in the second direction D2 perpendicular to the first direction D1, but it is not limited thereto. Through the design as above, the risk of the light emitted by the light-emitting elements 22 being interfered by the second part 265 may be reduced. In some embodiments, a distance S2 of the first virtual line 43 and the virtual line 42 in the second direction D2 may be greater than 0. In some embodiments (not shown), a distance S2 of the first virtual line 43 and the virtual line 42 in the second direction D2 may be equal to 0.

In some embodiments, one of the plurality of light emitting elements 22 may have a fifth width W22 in the first direction D1, the fifth width W22 is a maximum width of the one of the plurality of light-emitting elements 22 in the first direction D1. In some embodiments, the light-emitting elements 22 may have a packaging element P and a light-emitting diode (not shown) packaged by the packaging element P, and the maximum width of the light-emitting elements 22 may be defined by a maximum width of the packaging element P, but it is not limited thereto. In other embodiments, the light-emitting elements 22 does not have a packaging element P, and the maximum width of the light-emitting elements 22 may be defined by a maximum width of the light-emitting diode.

In some embodiments, there is a distance G between adjacent ones of the plurality of light-emitting elements 22 in the first direction D1. The distance G may be defined by a minimum distance between the adjacent ones of the plurality of light-emitting elements 22. In some embodiments, the second width W1 and the distance G may satisfy the following relation: 0.5≤(second width W1/distance G)≤4, but it is not limited thereto. In some embodiments, the second width W1 and the distance G may satisfy the following relation: 1≤(second width W1/distance G)≤3.5. In some embodiments, the second width W1 and the distance G may satisfy the following relation: 2≤(second width W1/distance G)≤3. In some embodiments, the second width W1, the fifth width W22 and the distance G may satisfy the following relations: second width W1>distance G, and 0<(second width W1−distance G)/fifth width W22≤0.7, but it is not limited thereto. In some embodiments, the second width W1, the fifth width W22 and the distance G may satisfy the following relations: second width W1>distance G, and 0.1≤(second width W1−distance G)/fifth width W22≤0.6. In some embodiments, the second width W1, the fifth width W22 and the distance G may satisfy the following relations: second width W1>distance G, and 0.2≤(second width W1−distance G)/fifth width W22≤0.5. By the design as above, the adhesive structure 26 can has larger area to attach to the light guide plate 23, or the design can increase the adhesion between the light guide plate 23 and the circuit board 21. The segmented elements 262 of the adhesive structure 26 would not significantly interfere the light emitted by the light-emitting elements 22. In some embodiment, the distance G and the third width W2 of the second part 265 may satisfy the following relation: third width W2<distance G.

In some embodiments, the circuit board 21 may have a first region R1 overlapping the light guide plate 23 in the normal direction D3 of the circuit board 21. For example, the first region R1 may be a region of the circuit board 21 located between the virtual line 42 and the side 211 of the circuit board 21. The first region R1 may have a plurality of unit regions RC. To be more specific, a virtual line C may be through a center of one of the light-emitting elements 22, and the virtual line C may be perpendicular to the virtual line 41. A unit region RC may be defined by a region enclosed by two adjacent virtual lines C, the virtual line 42 and the side 211 of the circuit board 21.

In some embodiments, a first area A1 may be an area of one of the plurality of unit regions RC, and a second area A2 may be an area of the second part 265 overlapping the one of the plurality of unit regions RC. In some embodiments, the first area A1 and the second area A2 may satisfy the following relation: 0.2≤(second area A2/first area A1)<0.7, but it is not limited thereto. In some embodiments, the first area A1 and the second area A2 may satisfy the following relation: 0.25≤(second area A2/first area A1)≤0.65. In some embodiments, the first area A1 and the second area A2 may satisfy the following relation: 0.3≤(second area A2/first area A1)≤0.6. By the design as above, the adhesive structure 26 can have larger area to attach to the light guide plate 23, or the design can increase the adhesion between the light guide plate 23 and the circuit board 21. The segmented elements 262 of the adhesive structure 26 would not significantly interfere the light emitted by the light-emitting elements 22.

As shown in FIG. 3, the electronic device 1 may further include a housing 10, the housing 10 may be configured to support the panel 30. In some embodiments, the housing 10 may be disposed adjacent to the circuit board 21 and the housing 10 partially overlapping the circuit board 21 and/or the adhesive structure 26 in the normal direction D3 of the circuit board 21. In some embodiments, the housing 10 may be attached to the circuit board 21 through the connection part 261 of the adhesive structure 26. In other embodiments (not shown), part of the housing 10 may overlap the connection part 261 and/or the first part 263 in the normal direction D3 of the circuit board 21, but it is not limited thereto. The panel 30 may include a substrate 31 (such as a color filter substrate) and/or a substrate 32 (such as a thin film transistor (TFT) substrate) disposed below the substrate 31, and the substrate 32 may be disposed between the backlight module 3 and the substrate 31, but it is not limited thereto. In some embodiments, the housing 10 may overlap the substrate 31 and/or the substrate 32 in the normal direction D3 of the circuit board 21. In some embodiments, a medium layer (not shown) may be disposed between the substrate 31 and the substrate 32, and the medium layer may include liquid-crystal or other suitable materials, but it is not limited thereto.

In some embodiments, the reflective layer 212 may be disposed on the circuit board 21, and the reflective layer 212 may be disposed between the adhesive structure 26 and the circuit board 21. In some embodiments, the light-emitting element 22 may include some conductive pads 214, and the light-emitting element 22 may be electrically connected to the circuit board 21 via the conductive pads 214. In some embodiments, part of the reflective layer 212 may overlap the light-emitting element 22 and/or the adhesive structure 26 in the normal direction D3 of the circuit board 21, but it is not limited thereto. In some embodiments, a thickness of the reflective layer 212 may be different from a thickness of the adhesive structure 26, but it is not limited thereto. In some embodiments, the thickness of the reflective layer 212 may be less than the thickness of the adhesive structure 26, but it is not limited thereto. For example, the thickness of the adhesive structure 26 may be twice of the thickness of the reflective layer 212, but it is not limited thereto. In some embodiments, the thickness of the reflection plate 24 may be different from the thickness of the circuit board 21. In some embodiments, the thickness of the reflection plate 24 may be less than the thickness of the circuit board 21, but it is not limited thereto. In some embodiments, the thickness of the reflection plate 24 may be different from the thickness of the reflective layer 212, but it is not limited thereto. In some embodiments, the thickness of the reflective layer 212 may be less than the thickness of the reflection plate 24, but it is not limited thereto. The thickness of the above layers or the above elements can be an average thickness measured in any three parts of the above layers or the above elements.

Figure 4:
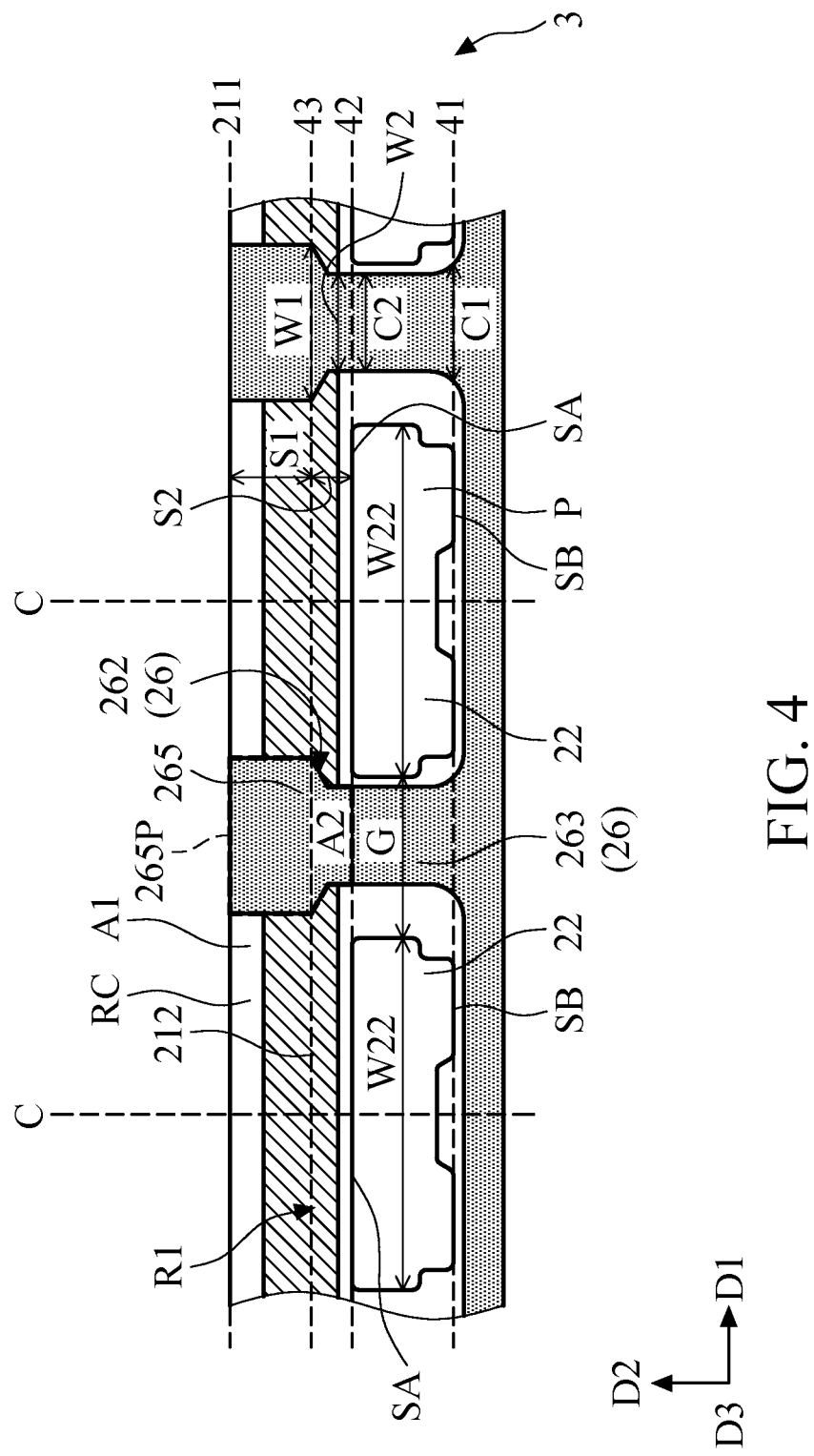
FIG. 4 is an enlarged top view illustrating the backlight module in accordance with some embodiments of the present disclosure.

FIG. 4 is an enlarged top view illustrating the backlight module 3 in accordance with some embodiments of the present disclosure. As shown in FIG. 4, in some embodiments, a distance may be between of the reflective layer 212 and the light emitting surface SA of one of the light-emitting elements 22 in the second direction D2, and the distance may be greater than 0, but it is not limited thereto. In some embodiments, the reflective layer 212 does not overlap the light-emitting elements 22 and/or the first parts 263 of adhesive structure 26 in the normal direction D3 of the circuit board 21, but it is not limited thereto. In some embodiments, a part of the second part 265 of adhesive structure 26 may overlap the reflective layer 212 in the normal direction D3 of the circuit board 21, and a part of the second part 265 of adhesive structure 26 does not overlap the reflective layer 212 in the normal direction D3 of the circuit board 21. In some embodiments, the first part 263 of adhesive structure 26 is between adjacent ones of the light-emitting elements 22, and the first part 263 may be separated by different distances with the adjacent ones of the light-emitting elements 22 in the first direction D1, but it is not limited thereto.

Figure 5:
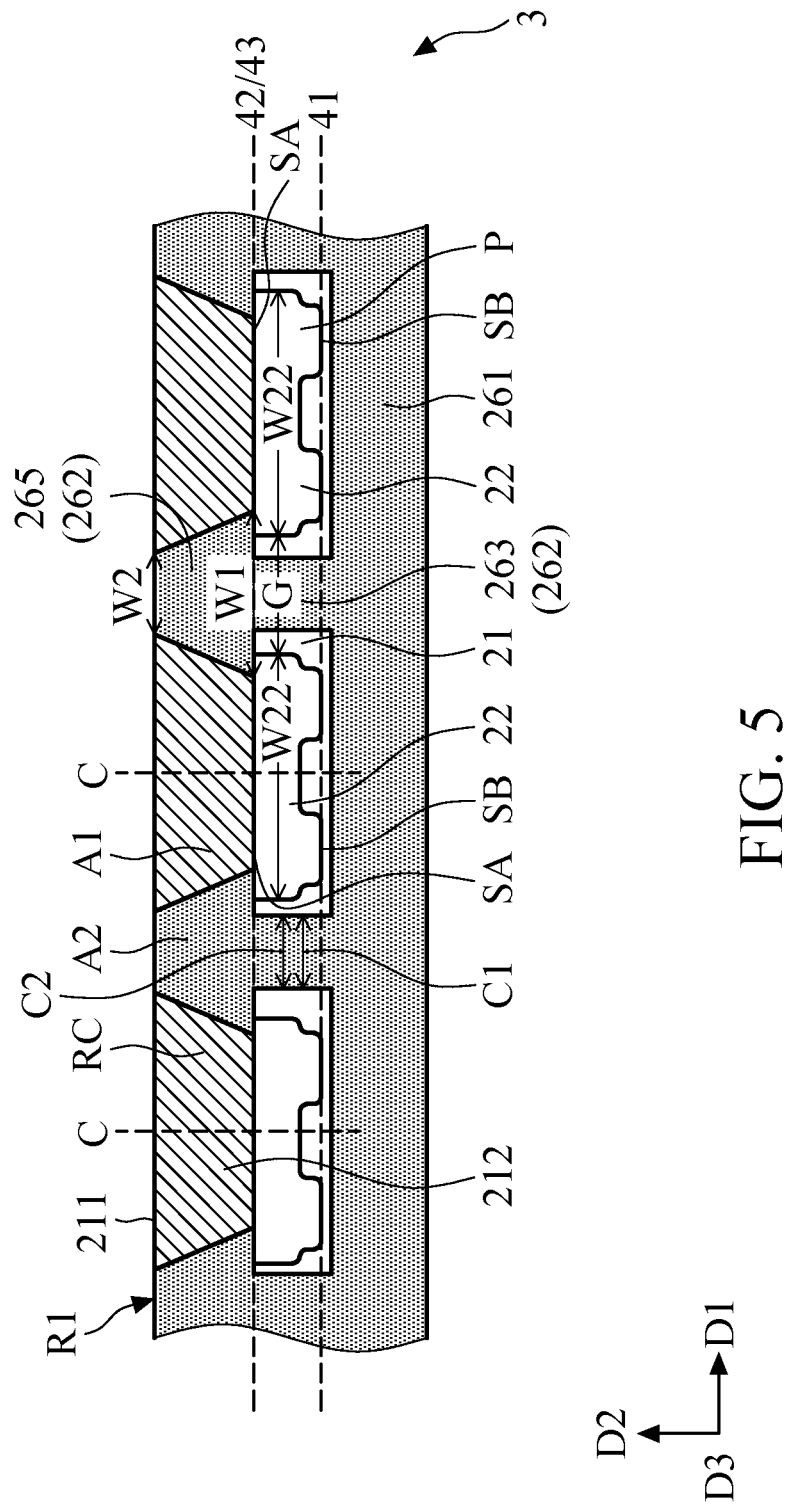
FIG. 5 is an enlarged top view illustrating the backlight module in accordance with some embodiments of the present disclosure.

FIG. 5 is an enlarged top view illustrating the backlight module 3 in accordance with some embodiments of the present disclosure. It should be noted that the backlight module 3 may include the same or similar elements or structures of the backlight module 3 shown in FIG. 2. These elements or structures will be labeled with the same or similar numerals and will not be discussed in detail again. For example, the backlight module 3 includes a plurality of light-emitting elements 22 and an adhesive structure 26 disposed between the light-emitting elements 22. As shown in FIG. 5, the second part 265 may be in an inverted trapezoid shape. Accordingly, the second part 265 may be tapered toward the side 211 of the circuit board 21. In some embodiments, the second width W1 of the second part 265 may be closer to the light-emitting elements 22 than the third width W2 of the second part 265. In some embodiments, a distance of the first virtual line 43 and the virtual line 42 in the second direction D2 may be equal to or greater than 0. In some embodiments, the first width C1 and the fourth width C2 may satisfy the following relation: $1 \leq$(first width C1/fourth width C2)$\leq 1.3$, but it is not limited thereto. In some embodiments, the first width C1 and the fourth width C2 may satisfy the following relation: $1.1 \leq$(first width C1/fourth width C2)$\leq 1.2$.

Figure 6:
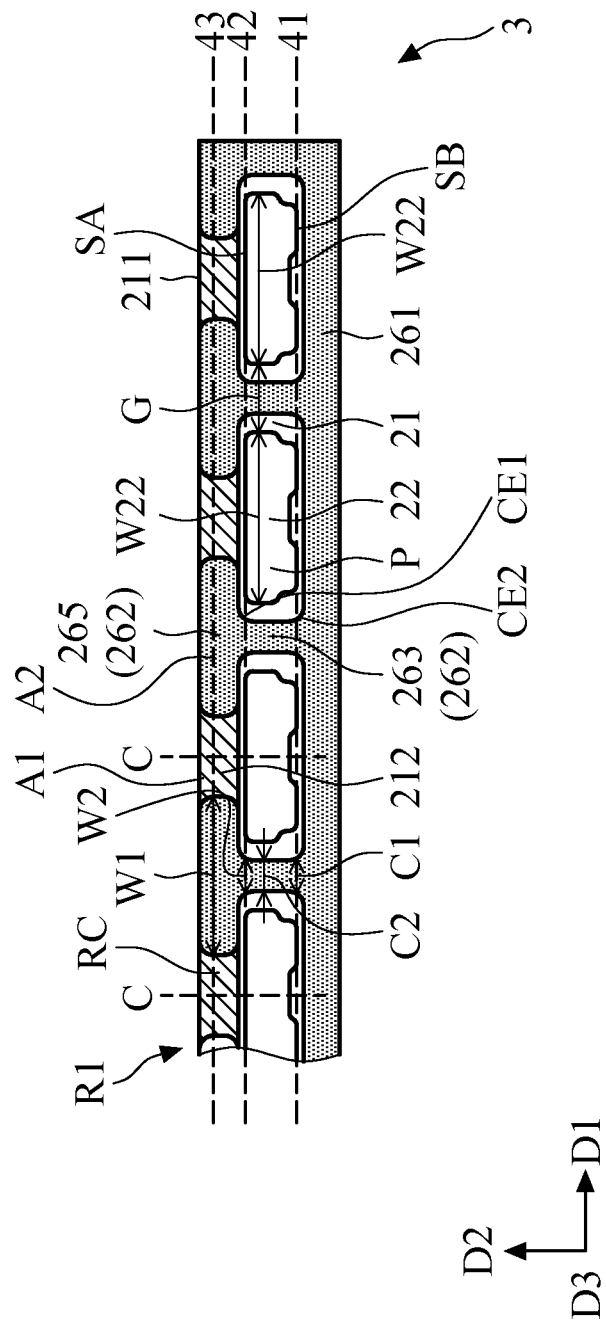
FIG. 6 is an enlarged top view illustrating the backlight module in accordance with some embodiments of the present disclosure.

FIG. 6 is an enlarged top view illustrating the backlight module 3 in accordance with some embodiments of the present disclosure. It should be noted that the backlight module 3 may include the same or similar elements or structures of the backlight module 3 shown in FIG. 2. These elements or structures will be labeled with the same or similar numerals and will not be discussed in detail again. For example, the backlight module 3 includes a plurality of light-emitting elements 22 and an adhesive structure 26 disposed between the light-emitting elements 22.

As shown in FIG. 6, in some embodiment, the second width W1 of the second part 265 and the third width W2 of the second part 265 may satisfy the following relation: $2.5 \leq$second width W1/third width W2$\leq 6$, but it is not limited thereto. In some embodiment, the second width W1 of the second part 265 and the third width W2 of the second part 265 may satisfy the following relation: $3 \leq$second width W1/third width W2$\leq 5$.

In some embodiment, the second width W1 of the second part 265 and the first width C1 of the first part 263 may satisfy the following relation: $2.5 \leq$second width W1/first width C1$\leq 6$, but it is not limited thereto. In some embodiment, the second width W1 of the second part 265 and the first width C1 of the first part 263 may satisfy the following relation: $3 \leq$second width W1/first width C1$\leq 5$.

In some embodiment, the distance G between the adjacent ones of the light-emitting elements 22 and the third width W2 of the second part 265 may satisfy the following relation: third width W2<distance G. In some embodiment, the first area A1 and the second area A2 may satisfy the following relation: $0.35 \leq$(second area A2/first area A1)$\leq 0.65$, but it is not limited thereto. The first area A1 and the second area A2 can be defined as above in FIG. 4. In some embodiment, the first area A1 and the second area A2 may satisfy the following relation: $0.4 \leq$(second area A2/first area A1)$\leq 0.6$. In some embodiment, the first area A1 and the second area A2 may satisfy the following relation: $0.45 \leq$(second area A2/first area A1)$\leq 0.55$.

In some embodiment, the adhesive structure 26 may have a profile, and a part of the profile may be curved. In some embodiment, the second part 265 of the adhesive structure 26 may have a curved edge CE1 adjacent to the first part 263, but it is not limited thereto. In some embodiment, the connection part 261 of the adhesive structure 26 may have a curved edge CE2 adjacent to the first part 263, but it is not limited thereto. By the design as above, the risk of the cracking of the adhesive structure 26 may be reduced. In some embodiment (not shown), the first part 263 of the adhesive structure 26 may have a curved edge adjacent to the second part 265 or the connection part 261.

Figure 7:
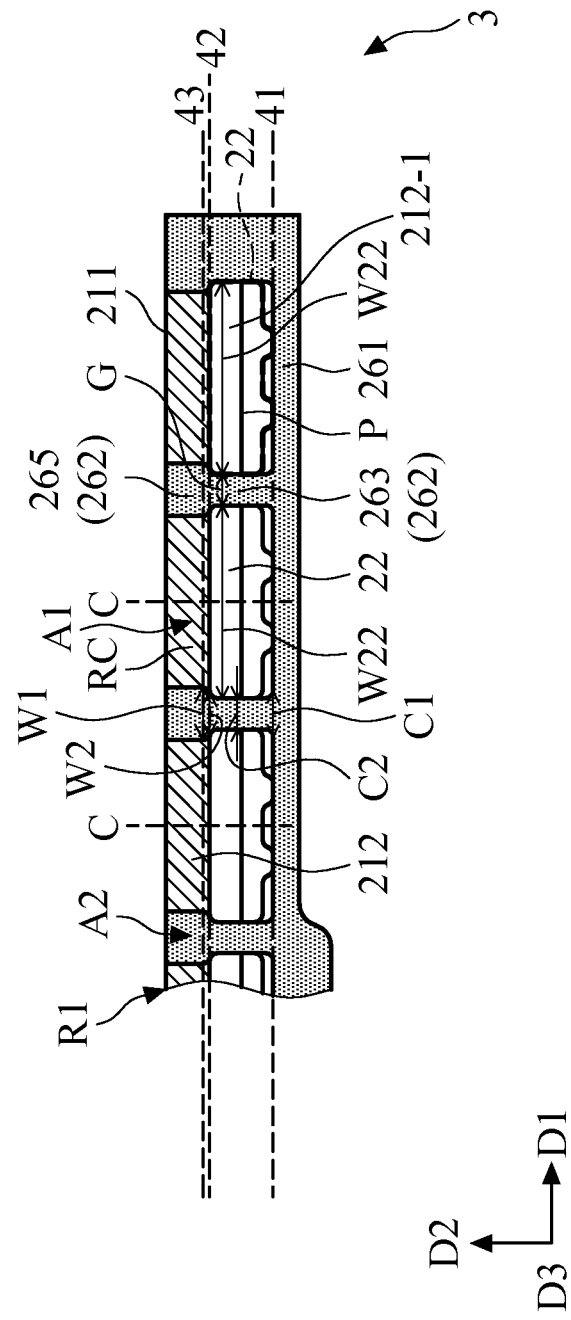
FIG. 7 is an enlarged top view illustrating the backlight module in accordance with some embodiments of the present disclosure.

FIG. 7 is an enlarged top view illustrating the backlight module 3 in accordance with some embodiments of the present disclosure. It should be noted that the backlight module 3 shown in the present embodiment may include the same or similar elements or structures of the backlight module 3 shown in FIG. 2. These elements or structures will be labeled with the same or similar numerals and will not be discussed in detail again. For example, the backlight module 3 includes a plurality of light-emitting elements 22 and an adhesive structure 26 disposed between the light-emitting elements 22.

As shown in FIG. 7, in some embodiments, the reflective layer 212-1 may disposed on the packaging element P, but it is not limited thereto. In some embodiments, the packaging element P of the light-emitting elements 22 may include a black material or other color material, but it is not limited thereto. In some embodiments, the material of the reflective layer 212-1 may be the same as the material of the reflective layer 212. In some embodiments, the material of the reflective layer 212-1 may be different from the material of the reflective layer 212.

As shown in FIG. 7, the distance G between the adjacent light-emitting elements 22 may be smaller, and the fifth width W22 of the light-emitting elements 22 and distance G may satisfy the following relation: $2.5 \leq$fifth width W22/distance G$\leq 10$, but it is not limited thereto. In some embodiment. the fifth width W22 of the light-emitting elements 22 and the distance G may satisfy the following relation: $3 \leq$fifth width W22/distance G$\leq 9$. In some embodiment, the fifth width W22 of the light-emitting elements 22 and the distance G may satisfy the following relation: $4 \leq$fifth width W22/distance G$\leq 8$.

As shown in FIG. 7, the second width W1 of the second part 265 and the distance G may satisfy the following relation: $0.8 \leq$second width W1/distance G$\leq 1.4$, but it is not limited thereto. In some embodiment, the second width W1 of the second part 265 and the distance G may satisfy the following relation: $0.8 \leq$second width W1/distance G$\leq 1.2$.

In some embodiment, the second width W1 of the second part 265 and the first width C1 of the first part 263 may satisfy the following relation: $0.8 \leq$second width W1/first width C1$\leq 1.4$, but it is not limited thereto. In some embodiment, the second width W1 of the second part 265 and the first width C1 of the first part 263 may satisfy the following relation: $0.8 \leq$second width W1/first width C1$\leq 1.2$.

As shown in FIG. 7, in some embodiment, the first area A1 and the second area A2 may satisfy the following relation: $0.05 \leq$(second area A2/first area A1)$\leq 0.4$, but it is not limited thereto. The first area A1 and the second area A2 can be defined as above in FIG. 4. In some embodiment, the first area A1 and the second area A2 may satisfy the following relation: $0.1 \leq$(second area A2/first area A1)$\leq 0.35$. In some embodiment, the first area A1 and the second area A2 may satisfy the following relation: $0.15 \leq$(second area A2/first area A1)$\leq 0.3$.

Figure 8:
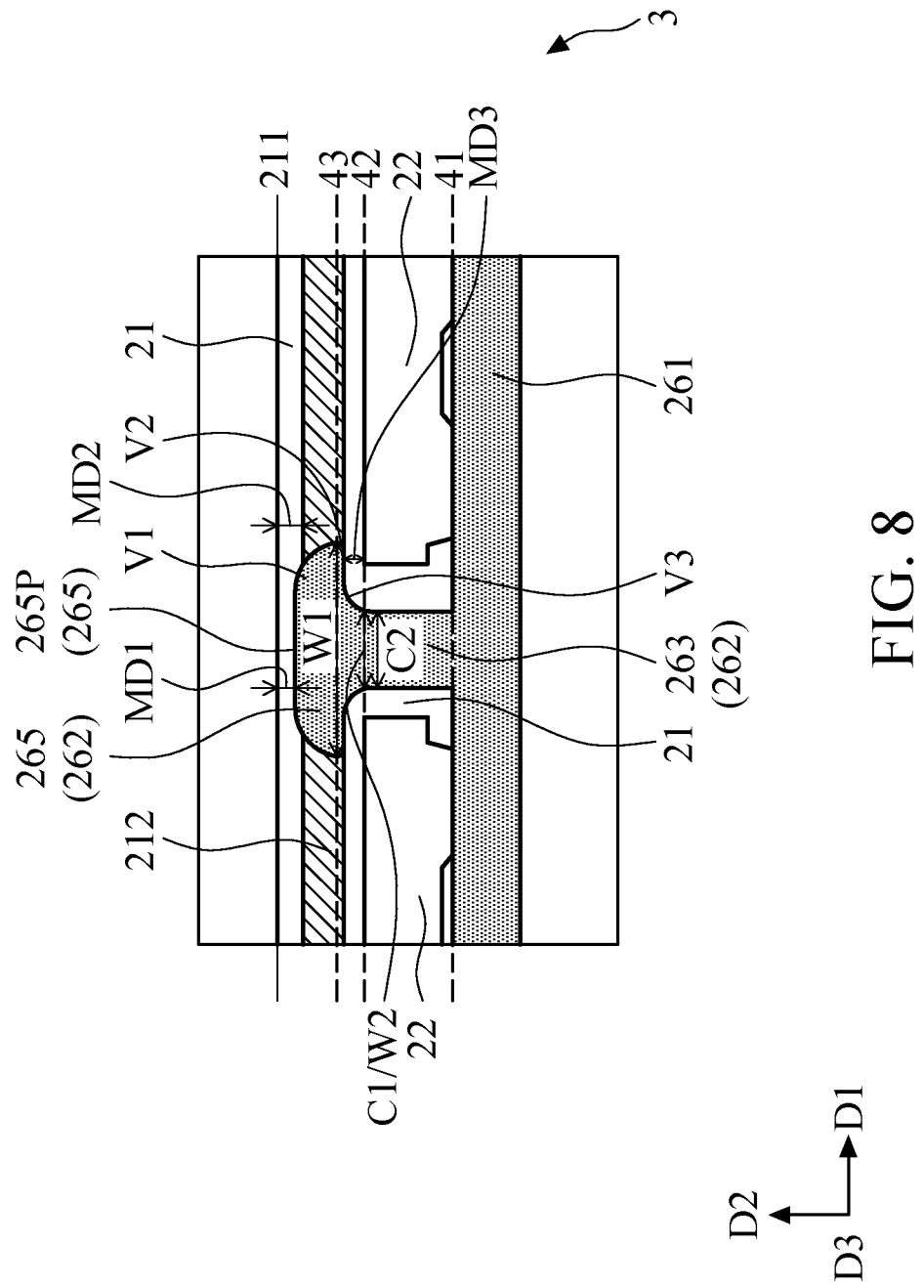
FIG. 8 is an enlarged top view illustrating the backlight module in accordance with some embodiments of the present disclosure.

FIG. 8 is an enlarged top view illustrating the backlight module 3 in accordance with some embodiments of the present disclosure. It should be noted that the backlight module 3 shown in the present embodiment may include the same or similar elements or structures of the backlight module 3 shown in FIG. 2. These elements or structures will be labeled with the same or similar numerals and will not be discussed in detail again. For example, the backlight module 3 includes a plurality of light-emitting elements 22 and an adhesive structure 26 disposed between the light-emitting elements 22.

As shown in FIG. 8, the second part 265 may be misaligned with the side 211 of the circuit board 21. To be more specific, the second part 265 may be separated from the side 211 of the circuit board 21 by a distance MD1 in the second direction D2 perpendicular to the first direction D1, and the distance MD1 may be greater than 0. The distance MD1 may be a minimum distance between the second part 265 and the side 211 in the second direction D2.

In some embodiments, the reflective layer 212 may be misaligned with the side 211 of the circuit board 21. To be more specific, the reflective layer 212 may be separated from the side 211 of the circuit board 21 by a distance MD2 in the second direction D2, and the distance MD2 may be greater than 0. The distance MD2 may be a minimum distance between the reflective layer 212 and the side 211 in the second direction D2.

In some embodiments, the distance MD1 may be less than the distance MD2. In other embodiments (not shown), the distance MD1 may be greater than or equal to the distance MD2.

In some embodiments, the second part 265 may be separated from and one of the plurality of light-emitting elements 22 by a distance MD3 in the second direction D2, and the distance MD3 may be greater than 0. The distance MD3 may be a minimum distance between the second part 265 and the one of the plurality of light-emitting elements 22 in the second direction D2.

In some embodiments, the second part 265 may have a profile 265P, and a part of the profile 256P may be curved. The profile 265P may include at least curved edge, such as curved edge V1, curved edge V2, and/or curved edge V3. The profile 265P of the second part 265 may be viewed along the normal direction D3 of the circuit board 21. These curved edges may help to relief the stress at the corners of the adhesive structure 26. As such, the risk of the cracking of the adhesive structure 26 may be reduced. In some embodiments, the curvatures of the curved edges may be different from each other.

Figure 9:
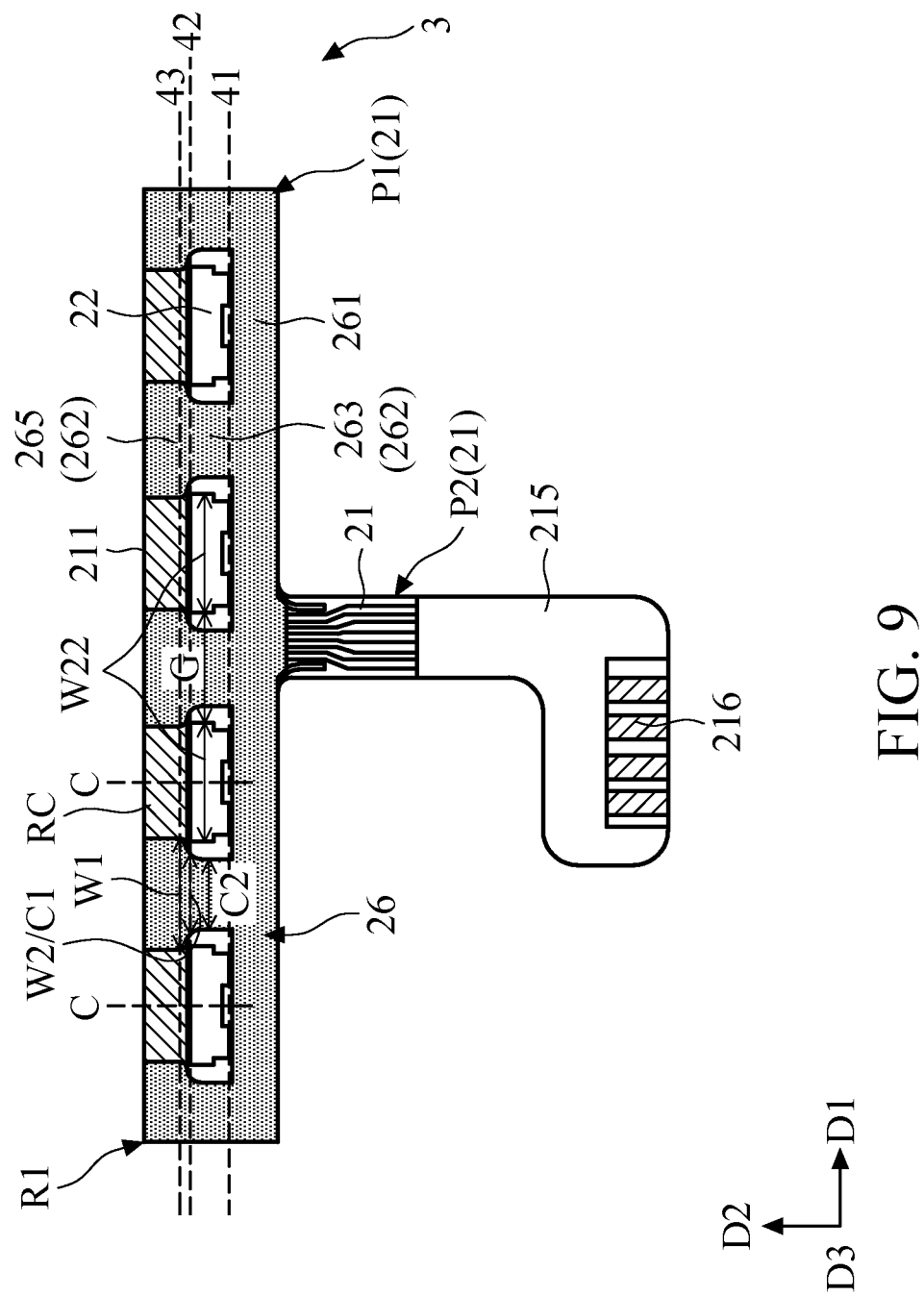
FIG. 9 is an enlarged top view illustrating the backlight module in accordance with some embodiments of the present disclosure.

FIG. 9 is an enlarged top view illustrating the backlight module 3 in accordance with some embodiments of the present disclosure. It should be noted that the backlight module 3 shown in the present embodiment may include the same or similar elements or structures of the backlight module 3 shown in FIG. 2. These elements or structures will be labeled with the same or similar numerals and will not be discussed in detail again. For example, in the present embodiment, the backlight module 3 includes a plurality of light-emitting elements 22 and an adhesive structure 26 disposed between the light-emitting elements 22.

As shown in FIG. 9, the distance G between the adjacent light-emitting elements 22 may be larger, and the fifth width W22 of the light-emitting elements 22 and the distance G may satisfy the following relation: $0.75 \leq$ fifth width W22/distance $G \leq 1.35$, but it is not limited thereto. In some embodiments, the fifth width W22 of the light-emitting elements 22 and the distance G may satisfy the following relation: $0.8 \leq$ fifth width W22/distance $G \leq 1.3$. In some embodiments, the fifth width W22 of the light-emitting elements 22 and the distance G may satisfy the following relation: $0.85 \leq$ fifth width W22/distance $G \leq 1.2$. In some embodiments, the second width W1 of the second part 265 and the distance G may satisfy the following relation: $0.7 \leq$ second width W1/distance $G \leq 1.3$, but it is not limited thereto. In some embodiments, the second width W1 of the second part 265 and the distance G may satisfy the following relation: $0.8 \leq$ second width W1/distance $G \leq 1.2$. In some embodiments, the second width W1 of the second part 265 and the distance G may satisfy the following relation: $0.85 \leq$ second width W1/distance $G \leq 1.15$. In some embodiment, the circuit board 21 may have a first part P1 and a second part P2 connected with the first part P1, the first part P1 may extend along the first direction D1, and the second part P2 may extend along a direction (such as the second direction D2) different from the first direction D1. The light-emitting elements 22 may be disposed on the first part P1, and the second part P2 may be away from the side 211 of the circuit board 21. In some embodiments, an insulating element 215 may overlap with a part of the second part P2 in the normal direction D3 of the circuit board 21, and another part of the second part P2 does not overlap with the insulating element 215 in the normal direction D3 of the circuit board 21 may be used as a connector 216. In some embodiments, the external signals can transmit to the light-emitting elements 22 through the connector 216.

As set forth above, the embodiments of the present disclosure provide a backlight module and an electronic device including an adhesive structure, the adhesive structure may have a plurality of segmented elements separated from each other. In some embodiments, the segmented element may has a first part and a second part, the width of the second part may be greater the width of the first part. By the design as above, the adhesive structure 26 can have larger area to attach to the light guide plate 23, or the design can increase the adhesion between the light guide plate 23 and the circuit board 21. The segmented elements 262 of the adhesive structure 26 would not significantly interfere the light emitted by the light-emitting elements 22.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. An electronic device, comprising:
a circuit board;
a first light-emitting element and a second light-emitting element disposed on the circuit board along a first direction;
a light guide plate;
an adhesive structure disposed between the circuit board and the light guide plate and having a first opening and a second opening; and
a reflective layer disposed between the adhesive structure and the circuit board, wherein the first light-emitting element and the second light-emitting element are disposed in the first opening and the second opening respectively, wherein a portion of the adhesive structure disposed between the first opening and the second opening comprises a first part and a second part, the first part is disposed between the first light-emitting element and the second light-emitting element, and the second part is connected with the first part and extends toward the light guide plate, and wherein the first part has a first maximum width along the first direction, the second part has a second maximum width along the first direction, and the second maximum width is greater than the first maximum width.

2. The electronic device as claimed in claim 1, wherein the second part of the adhesive structure has a profile, and a part of the profile is curved.

3. The electronic device as claimed in claim 1, wherein the adhesive structure comprises a connection part connected to the first part, and the connection part extends along the first direction.

4. The electronic device as claimed in claim 3, further comprising a panel partially overlapping with the circuit board in a normal direction of the circuit board.

5. The electronic device as claimed in claim 4, further comprising a housing configured to support the panel and partially overlapping the adhesive structure in the normal direction of the circuit board.

6. The electronic device as claimed in claim 5, wherein the housing is attached to the circuit board through the connection part of the adhesive structure.

7. The electronic device as claimed in claim 1, wherein the light guide plate is attached to the second part of the adhesive structure.

8. The electronic device as claimed in claim 1, wherein the first maximum width and the second maximum width satisfy the following relation:

$$1 < (\text{second maximum width}/\text{first maximum width}) \leq 7.$$

9. The electronic device as claimed in claim 1, wherein there is a distance between the first light-emitting element and the second light-emitting element in the first direction, and the second maximum width and the distance satisfy the following relation:

$$0.5 \leq (\text{second maximum width}/\text{distance}) \leq 4.$$

10. The electronic device as claimed in claim 1, wherein the adhesive structure comprises a connection part connected to the first part and overlapped the reflective layer.

* * * * *